United States Patent [19]
Lopez et al.

[11] Patent Number: 5,883,831
[45] Date of Patent: Mar. 16, 1999

[54] SERIAL ACCESS MEMORY WITH SECURING OF WRITE OPERATIONS

[75] Inventors: Joaquim Ramon Lopez; David Naura, both of Aix-En-Provence, France

[73] Assignee: SGS-Thomson Microelectronics S.A., Saint Genis, France

[21] Appl. No.: 940,193

[22] Filed: Sep. 29, 1997

[30] Foreign Application Priority Data

Sep. 30, 1996 [FR] France .................................. 96 12153

[51] Int. Cl.⁶ .................................................. G11C 11/34
[52] U.S. Cl. .............................. 365/185.04; 365/185.08; 365/185.11; 365/189.07
[58] Field of Search .......................... 365/185.04, 185.11, 365/185.18, 185.08, 189.07

[56] References Cited

U.S. PATENT DOCUMENTS

| | | | |
|---|---|---|---|
| 4,321,695 | 3/1982 | Redwine et al. | 365/174 |
| 4,654,829 | 3/1987 | Jiang et al. | 365/229 |
| 4,868,789 | 9/1989 | Mac Donald | 365/200 |
| 5,072,138 | 12/1991 | Slemmer et al. | 307/465 |
| 5,262,984 | 11/1993 | Noguchi et al. | 365/185 |
| 5,467,309 | 11/1995 | Tanaka et al. | 365/185.14 |
| 5,555,214 | 9/1996 | Sung et al. | 365/221 |
| 5,617,559 | 4/1997 | Le et al. | 395/496 |
| 5,706,232 | 1/1998 | McClure et al. | 365/201 |
| 5,757,715 | 5/1998 | Williams et al. | 365/230.03 |
| 5,784,332 | 7/1998 | Zheng et al. | 365/233 |

OTHER PUBLICATIONS

French Search Report from French Application No. 96 12153, filed Sep. 30, 1996.
*MOS Memory Databook*, 1984, National Semiconductor Corporation, pp. 7–17.
New Electronics Incorporating Electronics Today, Moorwood: *EEPROMS Come of Age with Control and Interface Integration*, pp. 87–90.
Electronique Radio Plans, No. 548, Jul. 1, 1993, Les E2PROM Serie Securisees, pp. 24–25.

*Primary Examiner*—David Nelms
*Assistant Examiner*—Hien Nguyen
*Attorney, Agent, or Firm*—Wolf, Greenfield & Sacks P.C.

[57] ABSTRACT

Disclosed is a serial access memory and a method of writing in said memory comprising at least one matrix of memory cells, a clock signal input terminal receiving a clock signal, a data input terminal receiving a defined number of data bits in series and a selection terminal receiving a selection signal, said method being initialized when the selection signal changes state from a first state to a second state. The writing in the matrix of memory cells occurs only if the selection signal goes from the second state to the first state during a window located just after the last of the data bits has been received.

27 Claims, 4 Drawing Sheets

FIG. 5

SERIAL ACCESS MEMORY WITH SECURING OF WRITE OPERATIONS

BACKGROUND OF THE INVENTION

1. Field of the Invention

The present invention relates to a serial access memory with securing of the write operations. The invention is particularly suited to floating-gate memories and one-time programmable memories.

2. Discussion of the Related Art

EPROM or EEPROM type floating-gate memories, when they are non-programmed, are in an intermediate state between a "0" logic level and a "1" logic level. To write in these cells, high voltages are used to shift the charges from the intermediate level to the desired level "0" or "1". To enable writing to be done again in these cells, it is highly advisable to erase them beforehand, namely to reset the memory cells to the intermediate level. For EPROM type memories, this is done by exposure to ultraviolet radiation. For EEPROM type memories, it is done by using voltages that are slightly greater than those used for programming, with a different bias.

These floating-gate memories are often used in portable electronic card devices such as chip cards. The pads in these connection devices tend to get worn out through frequent actions of connection and disconnection. This wearing out of the pads has the effect of introducing a big parasitic pulse in these pads. When a reading operation is erroneous, it is enough to redo it to obtain efficient reading. However, when there is an erroneous write operation, it is sometimes not possible, and at best is difficult to correct it.

In the case of a write operation, it is therefore preferable not to write erroneous data. Indeed, one-time programmable memories cannot be reprogrammed, the EPROM memories need an ultraviolet radiation source to be erased, and the EEPROM type memories used in chip cards do not routinely have the load pumps needed for reprogramming.

The sources of erroneous write operations due to parasitic pulses coming from the pads generally result in positive or negative pulses at the terminals providing access to the memory. In the case of serial memories, the parasitic pulses may affect the data elements directly or indirectly. This means that the parasitic pulses may affect the data elements or the control signals of the memory, making it carry out random type writing operations.

Embodiments of the invention propose to remedy the problem of writing erroneous data due to the presence of parasitic pulses in the control signal. Indeed, in embodiments of the invention, it is not possible to write a data element if an error is detected in the synchronization of the control signals. For this purpose, a writing operation will be performed only if it is ascertained that a signal for the selection of the memory changes after the reception of the data elements.

SUMMARY OF THE INVENTION

An object of the invention is a method of writing data in a serial access memory comprising at least one matrix of memory cells, a clock signal input terminal receiving a clock signal, a data input terminal receiving a defined number of data bits in series and a selection terminal receiving a selection signal, the method being initialized when the selection signal changes state from a first state to a second state, wherein the writing in the matrix of memory cells occurs only if the selection signal goes from the second state to the first state during a period of the clock signal located just after the last of the data bits has been received.

A check is performed on the basis of the selection signal and the clock signal. This eliminates errors due to parasitic pulses present on only one signal of the two signals and also eliminates errors due to parasitic pulses present simultaneously on both signals in more than 95% of cases.

To avoid having a desynchronization of data elements with respect to the two signals, the method is initialized if a starting bit, positioned in a predefined state, is received at the data input terminal at the beginning of a clock period during which there is a change in state of the selection signal from the first state to the second state. Furthermore, the starting bit is followed by a succession of bits each spaced out by a clock period, these bits corresponding to instructions, addresses and data elements.

Another object of the invention is to provide a serial access memory comprising at least one matrix of memory cells, a clock signal input terminal receiving a clock signal, a data input terminal receiving a defined number of data bits in series, a selection terminal receiving a selection signal and means to detect a change in state of the selection signal, wherein the memory comprises securing means to authorize writing in the matrix of memory cells only if the selection signal changes its state during a period of the clock signal that is placed just after the last of the data bits has been received.

Preferably, there is provided a system for memories that can work on two sizes of words. One and the same counter may be used to count the number of bits for both sizes of words.

BRIEF DESCRIPTION OF THE DRAWINGS

The invention will be understood more clearly and other advantages shall appear from the following description of a preferred non-restrictive embodiment, the description referring to the appended drawings, of which.

DETAILED DESCRIPTION

Figure 1:
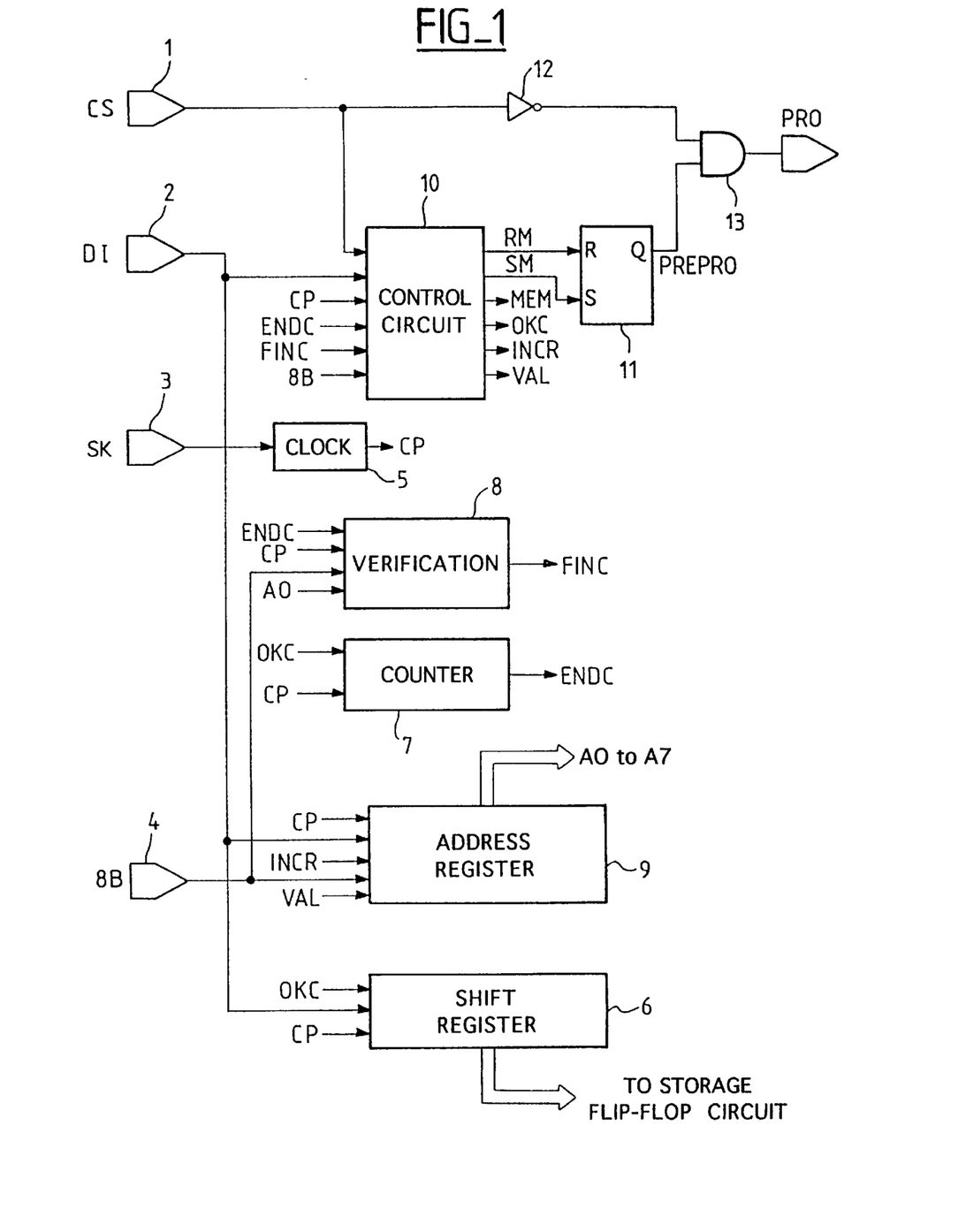
FIG. 1 shows a preferred embodiment of a write control circuit of a serial access memory according to the invention.

FIG. 1 shows a circuit that is contained in a silicon chip. This silicon chip is a serial memory comprising at least one matrix of memory cells constituting the main memory of the circuit. Furthermore, the chip contains the standard elements of a floating-gate memory, for example row and column decoding circuits, load pumps, read and write amplifiers and a sequencing circuit. The circuit of FIG. 1 forms part of the sequencing circuit of the memory. In order to clarify FIG. 1, certain connections are not shown and have been replaced by the names of the signals.

The circuit of FIG. 1 comprises a first input terminal 1 receiving a signal CS, a second input terminal 2 receiving a signal DI, a third input signal 3 receiving a signal SK, and a fourth input terminal 4 receiving a signal 8B. These four input terminals 1 to 4 correspond, in the preferred embodiment, to four pads of the silicon chip. The signal CS is a chip selection signal which, in our example, is active in the state "1". Preferably, the signal DI is an input/output signal used to convey instructions, addresses and data elements between the memory and the exterior. The signal SK is a clock signal generated by a device external to the chip.

The signal 8B indicates a mode of operation of the memory that corresponds to the word size of the data elements, which could be for example in 8 or 16 bits. In one example, the fourth input terminal 4 is connected definitively either to the ground or to the supply voltage at the time of the encapsulation of the silicon chip in its package (or on the chip card).

A clock signal shaping circuit 5 possesses an input, connected to the third input terminal 3, and an output. The clock signal shaping circuit 5 converts the signal SK into a pulse signal CP adapted to the thresholds of the different synchronous elements of the memory. A circuit of this kind may be formed for example by a trigger and a monostable circuit. The clock signal shaping circuit is aimed at eliminating small-amplitude parasitic pulses present on the signal SK. However, parasitic pulses of substantial amplitude may be converted into pulses on the signal CP.

A shift register 6 has a series input connected to. the second input terminal 2, a clock signal input connected to the output of the clock signal shaping circuit 5, an enabling input and a parallel output. In the present example, the shift register 6 is an 8-bit register, the contents of the register being permanently visible on the parallel output. The enabling input receiving the signal OKC is used to indicate whether the register will shift all its bits by one position and load the bit present at the series input into the cell closest to the series input. The parallel output is connected to a bus used to load the contents of the shift register into storage flip-flop circuits used as a buffer for the matrix of memory cells of the chip.

Other embodiments can be envisaged for the shift register 6. This register 6 may be a two-way register, namely it may be used for both reading and writing in the memory. If the circuit is a one-way circuit, the enabling input may also be eliminated. The register then carries out permanent shifting operations.

A counter 7 has a clock signal input connected to the output of the shaping circuit 5, an enabling input receiving the signal OKC and an output giving a signal ENDC. The signal ENDC indicates that the counter 7 has just carried out a complete cycle. The validation input is used firstly to reset the counter 7 at zero when it is in a first state and secondly to permit the counting when it is in the second state.

The verification circuit 8 has a clock signal input connected to the output of the shaping circuit 5 in order to receive the signal CP, an end-of-count input connected to the output of the counter 7 in order to receive the signal ENDC, a mode input connected to the fourth input terminal 4 in order to receive the signal 8B, a least significant bit input receiving the least significant address bit A0 and an output giving a signal FINC. The verification circuit 8 is used to determine the end of the reception of the data bits (during a writing operation) as a function of the mode of operation, namely 8-bit operation or 16-bit operation. This verification circuit 8 is described more specifically further below.

An address register 9 has a clock signal input connected to the output of the shaping circuit 5 in order to receive the signal CP, a series input connected to the second input terminal 2 in order to receive the signal DI, an incrementation input receiving a signal INCR, a mode input connected to the fourth input terminal 4 in order to receive the signal 8B, an enabling input receiving the signal VAL and a parallel output giving the address bits A0 to A7 on independent wires. One of the independent wires corresponding to the least significant bit A0 is connected to the least significant bit input of the verification circuit 8. All the independent wires of the parallel output are connected to the decoding circuits of the memory (not shown). The signal CP is used to set the rate of the serial arrival of the bits in the address register 9. The signal DI contains the address bits to be entered into the register at a given time. The signal VAL indicates whether the bit present at the series input of the address register 9 has to be entered into the register 9. The signal 8B indicates whether the address received corresponds to a memory address receiving 8-bit data elements or 16-bit data elements. The signal INCR is used to increment least significant bit of the address register 9 corresponding to A0 when the system is in 16-bit mode. An address register 9 of this kind is described here below.

A control circuit 10 possesses a selection input connected to the first input terminal 1 in order to receive the signal CS, an instruction input connected to the second input terminal 2 in order to receive the signal DI, a clock signal input connected to the output of the shaping circuit 5 in order to receive the signal CP, an end-of-count input connected to the output of the counter 7 in order to receive the signal ENDC, a verification input connected to the output of the verification circuit in order to receive the signal FINC, a mode of operation input connected to the fourth input terminal 4 in order to receive the signal 8B, a window-closing output giving the signal RM, a window-opening output giving the signal SM, a storage output giving the signal MEM, a count-enable output connected to the enable input of the shift register 6 and the enable input of the counter 7 in order to give the signal OKC, an incrementation output connected to the incrementation input of the address register 9 in order to give the signal INCR, and an address enable output connected to the enable input of the address register in order to give the signal VAL. The signal SM is used to activate the opening of a temporal window authorizing the write operation. The signal RM is used to close the temporal window authorizing the write operations. The signal MEM indicates the loading of the contents of the shift register 6 into the storage flip-flop circuits used as a buffer for the matrix of memory cells of the chip. The signal OKC indicates the time when the counter 7 is in operation. The signal INCR indicates the incrementation of the least significant bit A0 of the address register 9. The signal VAL indicates the time when the address register 9 is loaded. The control circuit 10 is actually a large sequencer which will be easier to understand by means of the timing diagrams described here below.

An RS type storage flip-flop circuit 11 has a zero-setting input connected to the window-closing output of the control circuit 10 in order to receive the signal RM, a one-setting input connected to the window-opening output of the control circuit 10 in order to receive the signal SM and an output giving the signal PREPRO. The signal PREPRO is a binary signal that can take two states. Arbitrarily, the state "1" corresponds to permission to write during a given temporal window.

An inverter 12 has an input connected to the first input terminal 1 in order to receive the signal CS, and an output. This inverter 12 is used to shape the signal CS so that it can be used in write enable mode. In one example, a threshold inverter 12 is used.

A logic gate 13 has a first input connected to the output of the inverter 12, a second input connected to the output of the storage flip-flop circuit 11 in order to receive the signal PREPRO, and an output giving the signal PRO. The signal PRO activates a writing sequence set up in a standard way. It must be noted however that, depending on the organization of the memory, in the case of 16-bit words, either two successive write operations are carried out in a memory organized in 8 bits or one write operation is carried out in two different memory arrays organized in 8-bit words.

Figure 2:
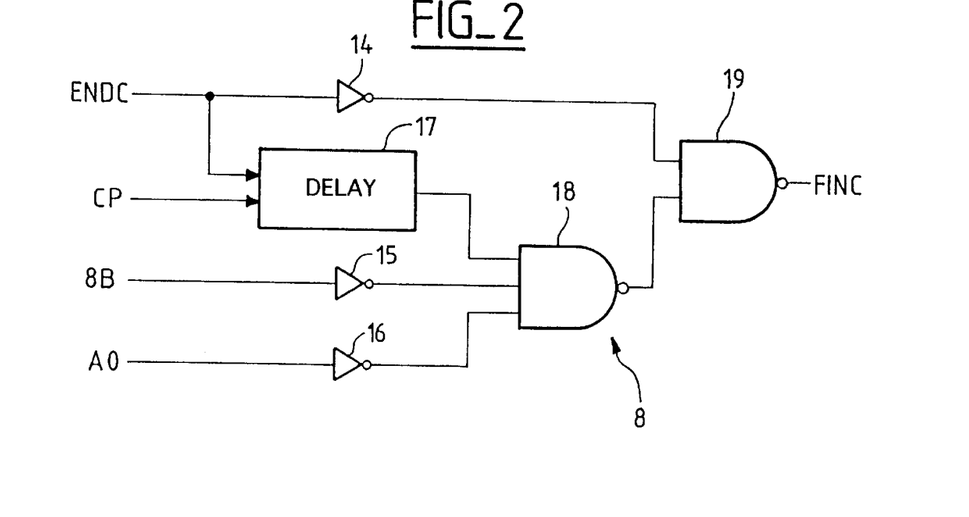
FIGS. 2 and 3 show details of the circuit of FIG. 1, FIGS. 4 and 5 show timing diagrams of operation of the circuit of FIG. 1 in two different modes of operation.

FIG. 2 shows the verification circuit 8 used in the preferred embodiment of the invention. This is only a possible embodiment given solely by way of an indication. This verification circuit 8 has a first inverter, a second inverter and a third inverter 14 to 16, each having one input and one output, a delay circuit 17 having two inputs and one output, a first NAND gate 18 having three inputs and one output and a second NAND gate having two inputs and one output.

The input of the first inverter 14 corresponds to the end-of-count input of the verification circuit 8. A first input of the delay circuit 17 corresponds to the clock signal input of the verification circuit 8. The input of the second inverter 15 corresponds to the mode input of the verification circuit 8. The input of the third inverter 16 corresponds to the least significant input of the verification circuit. The second input of the delay circuit 17 is connected to the input of the first inverter 14. The output of the first inverter 14 is connected to the first input of the second NAND gate 19. The output of the delay circuit 17 is connected to the first input of the first NAND gate 18. The output of the second inverter 15 is connected to the second input of the first NAND gate 18. The output of the third inverter 16 is connected to the third input of the first NAND gate 18. The output of the first NAND gate 18 is connected to the second input of the second NAND gate 19. The output of the second NAND gate corresponds to the output of the verification circuit 8 and produces the signal FINC.

The delay circuit 17 is used to delay the signal ENDC by one clock cycle. A simple D-type flip-flop circuit which receives the signal CP at its clock signal input and the signal ENDC at its D input is perfectly appropriate.

Should the signal 8B be at "1", namely when the memory works in 8-bit mode, the output of the second inverter 15 is at "0". Consequently, the output of the first NAND gate 18 is at "1". If ENDC is at "0", then the output of the first inverter 14 is at "1", hence the signal FINC is at "0". The signal FINC is the same as the signal ENDC (in discounting the periods of propagation of the different logic gates).

Should the signal 8B be at "0", namely when the memory works in 16-bit mode, the output of the first NAND gate 18 depends on its first and third input. If A0 is at "1", the third input of the first NAND gate is at "0" while the output of the first logic gate is necessarily at "1", implying that the signal FINC corresponds to the signal ENDC as explained here above. If, on the contrary, A0 is at "0" while the output of the first NAND gate 18 is identical to the output of the first inverter 14 but with a delay of one clock cycle, then the signal FINC will correspond to the signal ENDC extended by a clock period.

Figure 3:
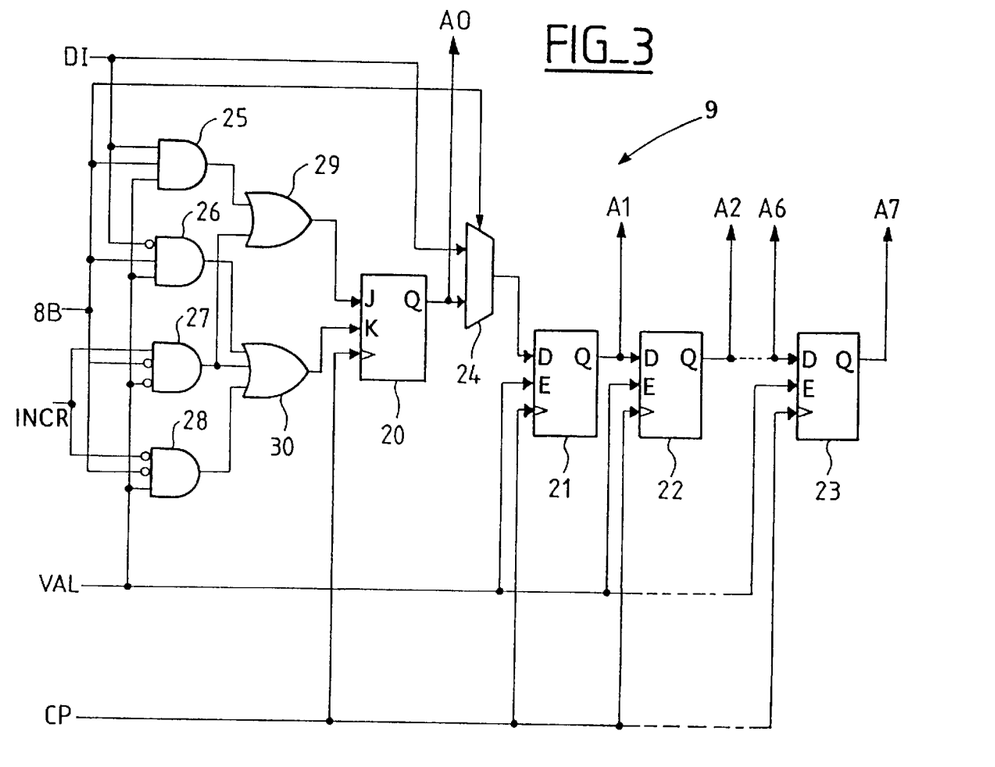

FIG. 3 shows the address register 9 used in the preferred embodiment of the invention. This is only a possibility of an embodiment given purely by way of an indication. The address register 9 comprises, in the example, eight storage flip-flop circuits of which only four are shown in FIG. 3, respectively the first, second, third and eighth flip-flop circuits 20 to 23. The first storage flip-flop circuit 20 is of the J-K type and is used to store the least significant bit of the address, the least significant bit possibly coming from the exterior or possibly being generated by the address register 9 depending on the mode of operation. The first storage flip-flop circuit has an input J, an input K, a clock signal input and an output Q. The second to eighth storage flip-flop circuits 21 to 23 are identical and are D-type flip-flop circuits used to memorize the seven most significant bits of the address. Each of circuits constituting the second to eighth storage flip-flop circuits 21 to 23 has a data input D, an enable input E, a clock signal input and an output Q. The address register 9 furthermore has a multiplexer 24 having first and second signal inputs, a selection input and an output, first to fourth AND gates 25 to 28 each having first to third inputs, some of which are inverter inputs, and one output; a first OR gate 29 having first and second inputs and one output, and a second OR gate 30 having first to third inputs and one output.

The clock signal input of the address register 9 is connected to the clock signal input of each of the storage flip-flop circuits 20 to 23 in order to synchronize all the storage flip-flop circuits 20 to 23 with one another. The series input of the register 9 is connected to the first input of the multiplexer 24, the first input of the first AND gate 25 and the first input which is an inverter of the second AND gate 26. The incrementation input of the address register 9 is connected to the first input of the third AND gate 27 and to the first input which is an inverter of the fourth AND gate 28. The mode input of the address register 9 is connected to the selection input of the multiplexer 24, the second inputs of the first and second AND gates 25 and 26 and the second inputs, which are inverter inputs, of the third and fourth AND gates 27 and 28. The enable input of the address register 9 is connected to the third inputs of the first, second and fourth AND gates 25, 26 and 28, the third input, which is an inverter input, of the third AND gate 27 and each of the enable inputs E of the second to the eighth storage flip-flop circuits. The parallel output of the address register 9 consists of all the outputs of the first to eighth storage flip-flop circuits 20 to 23.

Furthermore, the output of the first AND gate 25 is connected to the first input of the first OR gate 29. The output of the second AND gate 26 is connected to the first input of the second OR gate 30. The output of the third AND gate 27 is connected to the second inputs of the first and second OR gates 29 and 30. The output of the fourth AND gate 28 is connected to the third OR gate 30. The output of the first OR gate 29 is connected to the input J of the first storage flip-flop circuit 20. The output of the second OR gate 30 is connected to the input K of the first storage flip-flop 20. The output Q of the first storage flip-flop circuit is connected to the second input of the multiplexer 24. The output of the multiplexer 24 is connected to the data input D of the second storage flip-flop circuit 21. The outputs Q of the second to seventh storage flip-flop circuits 21 and 22 are respectively connected to the inputs D of the third to eighth storage flip-flop circuits 22 and 23.

The working of this address register 9 depends on the mode of operation chosen. If the signal 8B is at "1", namely if the operation is with 8-bit words, the multiplexer 24 sets up a connection between its second input and its output, the signal INCR becomes unnecessary and all the elements consisting of the AND gates 25 to 28, the OR gates 29 and 30 and the first storage flip-flop circuit 20 constitute a flip-flop circuit equivalent to one of the second to eighth storage flip-flop circuits 21 to 23. When the signal VAL is active, at each clock signal leading edge, the bit present at the data input of the address register 9 is entered into the first storage flip-flop circuit 20, the bit which was present in the first flip-flop circuit is shifted into the first flip-flop circuit, the bit present in the second flip-flop circuit is shifted into the third, and so on and so forth up to the eighth flip-flop circuit. When the signal VAL is inactive, the flip-flop circuits memorize their contents, leaving the bits A0 to A7 in an apparent and stable state on the parallel output wire of the register.

If the signal 8B is at "0", namely if the operation is with 16 bits, then the multiplexer 24 sets up a connection between its first input and its output and all the elements consisting of the AND gates 25 to 28, the OR gates 29 and 30 and the first storage flip-flop circuit 20 constitute a counter by two. Indeed, when the signal VAL is active, the first storage flip-flop circuit is positioned at "0" and the loading is done from the series input of the address register 9 into the second storage flip-flop circuit 21 and then into the other flip-flop circuits up to the eighth storage flip-flop circuit 23. When the signal VAL is inactive, then the contents of the second to the eighth flip-flop circuits are memorized and the contents of the first storage flip-flop circuit change state if, during a clock period, the signal INCR is active.

Other possible embodiments can be used to obtain an address register 9 with the same functions.

Figure 4:
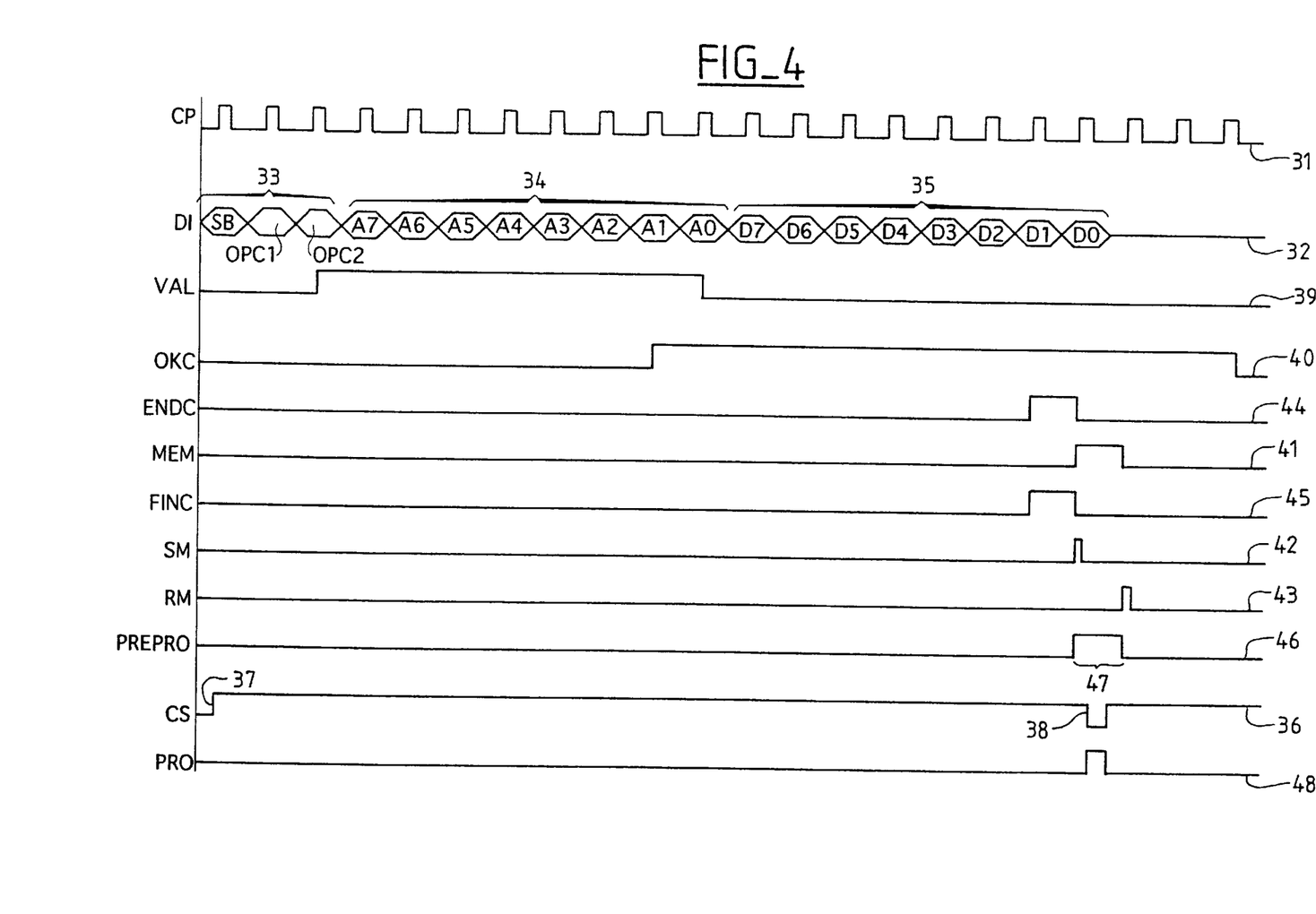

FIG. 4 shows timing diagrams corresponding to an 8-bit mode of operation, the signal 8B being positioned at "1". These timing diagrams provide for a clearer understanding of the working of the invention and will help in describing the control circuit 10.

The curve 31 shows the signal CP, namely the clock signal after shaping, this signal CP being normally formed by evenly spaced out identical pulses, the leading edges of this signal constituting the active moments of the signal CP. The curve 32 represents the signal DI which consists of a string of bits divided into control bits 33, address bits 34 and data bits 35. The curve 36 represents the signal CS which consists of a leading edge 37 indicating the start of the selection of the memory followed by a trailing edge 38 which has to enable the writing after the dispatch of all the data bits 35. The signals CP, DI and CS correspond to signals produced externally to the memory. Curves 39 to 43 correspond respectively to the signals VAL, OKC, MEM, SM and RM generated by the control circuit 10. A curve 44 corresponds to the end-of-count signal ENDC. A curve 45 corresponds to the signal FINC of the end of reception of the data bits. A curve 46 represents the signal PREPRO which shows the temporal window 47 authorizing a write operation. A curve 48 represents the write activation signal PRO.

At the starting point of the periods corresponding to the timing diagrams, the signal CS is at "0". The memory is considered to be in a waiting phase and all the signals produced internally to the memory are considered to be at "0". On a first clock stroke, there is a bit, for example at "1" which corresponds to the state that should be had by a starting bit SB during the change in state of the signal CS from "0" to "1". Since the signal CS is held at "1" up to the next clock signal edge, the control circuit will receive the remainder of the control bits 33 corresponding to an instruction of the memory. In the example, two bits OPC1 and OPC2 are used. During the reception of the second instruction bit OPC2, the control circuit positions the signal VAL at "1" for a period of eight clock cycles, as shown in the curve 39, in order to load the address A7 to A0 into the address register 9. The control circuit 10 in the meantime decodes the instruction designed to indicate the operation to be performed in the memory (reading, writing, testing, etc.). Hereinafter, we shall not deal with the case where the instruction code OPC1+OPC2 corresponds to a write operation. When the second last address bit A1 is loaded into the address register 9, the control circuit 10 positions the signal OKC at "1". This signal OKC activates the counter 7 and permits the reception of the bits on the shift register 6. At the end of eight clock cycles, the counter 7 indicates the end of count during a clock period on the signal ENDC. The verification circuit gives a signal FINC that is identical to the signal ENDC. The signal ENDC prompts the passage to "1" of the signal MEM which produces the loading of the contents of the shift register 6 into the storage flip-flop circuits of the write buffers. The simultaneous descent of the signals ENDC and FINC prompts a brief pulse on the signal SM followed, at the next clock stroke, by a brief pulse on the signal RM. The pulse of the signal SM causes the signal PREPRO to switch over to the state "1" and the pulse on the signal RM causes the signal PREPRO to switch over to the state "0". The signal PREPRO opens a write window 47 during a clock period immediately after the last of the data bits D0 has been received in theory. If the signal CS goes back to the state "0" while the signal PREPRO is at "1", then the signal PRO goes to "1". If the leading edge of the signal PRO does not correspond to a clock signal leading edge, then a write sequence is activated. This write sequence will consist in producing a programming voltage by load pumping and then in writing the data element present in the storage flip-flop circuits of the write buffers at the address present in the address register.

If there is a big parasitic pulse in the signal CS outside the write window 47, no data element is written. If the signal CS does not change its state during the write window 47, then no data element is written in the memory. If the leading edge 37 of the signal comes from a parasitic pulse enabled by a value of the signal DI corresponding to a starting bit, there is little likelihood that a trailing edge 38 will be present on the signal CS during the window 47. If a major parasitic pulse creates an additional clock pulse or eliminates a clock pulse, the window 47 will be shifted with respect to the edge 38 thus preventing the write operation. Should big parasitic pulses be produced on the two signals CP and CS simultaneously or offset by at least one write cycle, which is rare, it is possible in about 5% of cases that an erroneous write operation will be produced. This considerably reduces the risks of error.

Figure 5:
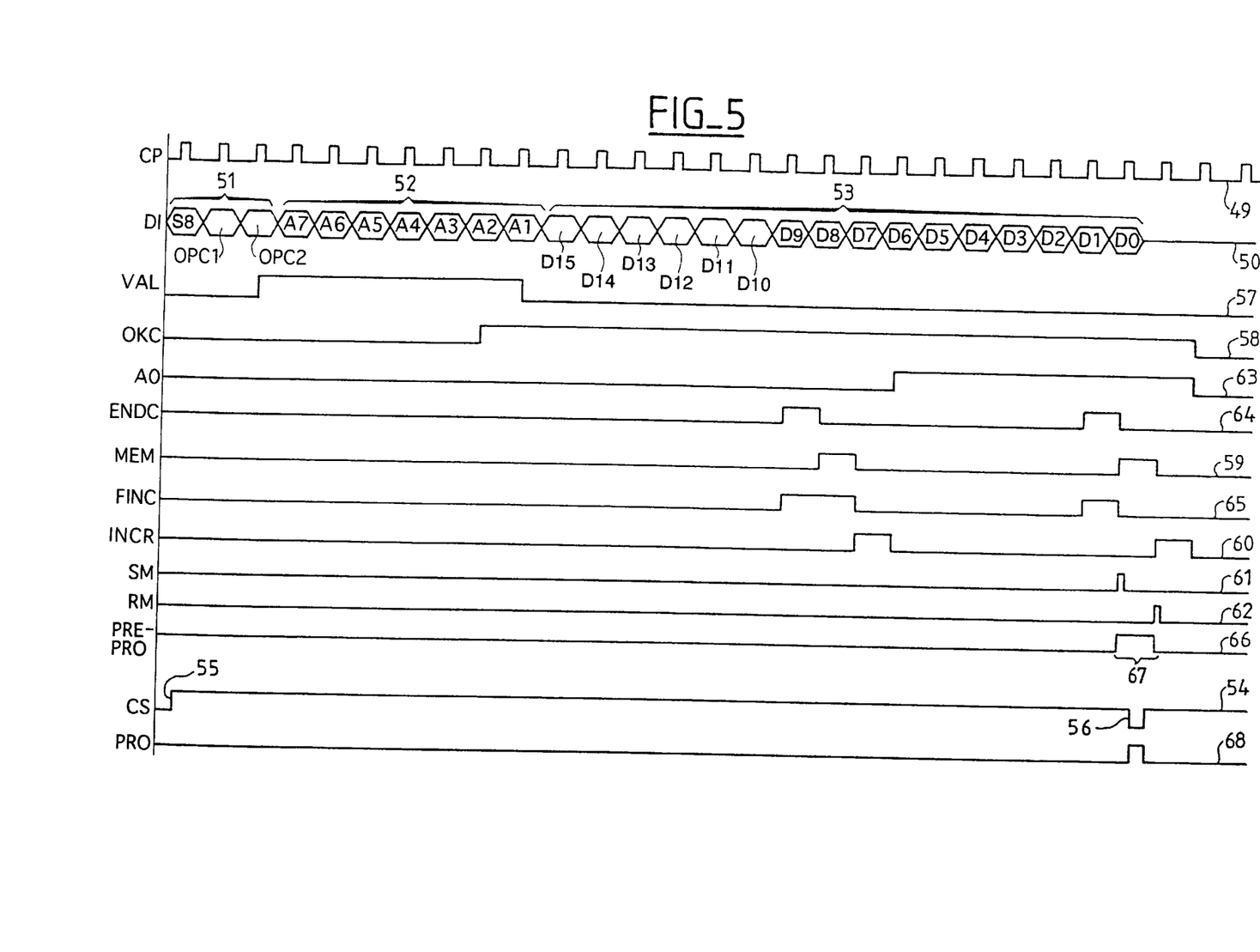

FIG. 5 shows timing diagrams corresponding to a mode of operation in 16 bits, the signal 8B being positioned at "0" These timing diagrams provide for a clearer understanding of the operation of the invention and will help in the making of the control circuit 10.

The curve 49 represents the signal CP, namely the clock signal after shaping. This signal CP is normally constituted by identical pulses that are evenly spaced out. The leading edges of this signal constitute the active moments of this signal CP. The curve 50 represents the signal DI which is constituted by a string of bits divided into control bits 51, address bits 52 and data bits 53. The curve 54 represents the signal CS constituted by a leading edge 55 indicating the start of the selection of the memory followed by a trailing edge 56 that must enable the write operation after the dispatch of all the data bits 53. The signals CP, DI and CS correspond to signals produced externally to the memory. Curves 57 to 62 respectively correspond to the signals VAL, OKC, MEM, INCR, SM and RM, generated by the control circuit 10. A curve 63 corresponds to the least significant bit of the address register 9. A curve 64 corresponds to the end-of-count signal ENDC. A curve 65 corresponds to the signal FINC for the end of reception of the data bits. A curve 66 represents the signal PREPRO which shows the temporal window 67 authorizing a write operation. A curve 68 represents the write activation signal PRO.

At the starting point of the periods corresponding to the timing diagrams, the signal CS is at "0". The memory is considered to be in a waiting phase and all the signals produced internally to the memory are considered to be at "0". On a first clock stroke, there is a bit, for example at "1" which corresponds to the state that should be had by a starting bit SB during the change in state of the signal CS from "0" to "1". Since the signal CS isheld at "1" up to the next clock signal edge, the control circuit will receive the remainder of the control bits 51 corresponding to an instruction of the memory. In the example, two bits OPC1 and OPC2 are used. During the reception of the second instruction bit OPC2, the control circuit positions the signal VAL at "1" for a period of seven clock cycles, as shown in the curve 57, in order to load the address A7 to A1 into the address register 9. The control circuit 10 in the meantime decodes the instruction designed to indicate the operation to be performed in the memory (reading, writing, testing, etc.). Hereinafter, we shall not deal with the case where the instruction code OPC1+OPC2 corresponds to a write operation. When the second last address bit A2 is loaded into the address register 9, the control circuit 10 positions the signal OKC at "1". This signal OKC activates the counter 7 and authorizes the reception of the bits on the shift register 6. At the end of eight clock cycles, the counter 7 indicates the end of a first count, during a clock period, on the signal ENDC. With the signal 8B being at "0" and the least significant bit A0 being at "0", the verification circuit gives a signal FINC extended by a clock period with respect to the signal ENDC. The signal ENDC prompts the passage to "1" of the signal MEM which produces the loading of the contents of the shift register 6 into the storage flip-flop circuits of the write buffers. The simultaneous descent of the signals ENDC and FINC prompts a pulse on the signal INCR aimed at increasing A0 from "0" to "1", thus changing the address of the next 8-bit word received. Eight clock cycles after having indicated the end of a first count, the counter 7 indicates the end of a second count, during a clock period, on the cycle ENC. With the signal 8B being at "0" and the least significant bit A0 being at "1", the verification circuit gives a signal FINC identical to the signal ENDC. The signal ENDC prompts the passage to "1" of the signal MEM which produces the loading of the contents of the shift register 6 into the storage flip-flop circuits of the write buffers. The simultaneous descent of the signals ENDC and FINC prompts a brief pulse on the signal SM followed at the next clock stroke by a brief pulse on the signal RM. The pulse on the signal SM causes the signal PREPRO to switch over to the state "1" and the pulse on the signal FM causes the signal PREPRO to switch over to the state "0". The signal PREPRO opens a write window 47 during a clock period immediately after the last of the data bits D0 has been received in theory. If the signal CS goes back to the state "0" while the signal PREPRO is at "1", then the signal PRO goes to "1". If the leading edge of the signal PRO does not correspond to a clock signal leading edge, then a write sequence is activated. This write sequence will consist in producing a programming voltage by load pumping and then in writing the data element present in the storage flip-flop circuits of the write buffers at the address present in the address register. The writing is done simultaneously or successively, depending on the physical organization of the memory.

If there is a big parasitic pulse in the signal CS outside the write window 67, no data element is written. If the signal CS does not change its state during the write window 67, then no data element is written in the memory. If the leading edge 55 of the signal comes from a parasitic pulse enabled by a value of the signal DI corresponding to a starting bit, there is little likelihood that a trailing edge 56 will be present on the signal CS during the window 67. If a big parasitic pulse creates an additional clock pulse or eliminates a clock pulse, the window 67 will be shifted with respect to the edge 56, thus preventing the write operation. Should big parasitic pulses be produced on the two signals CP and CS simultaneously or offset by at least one write cycle, which is rare, it is possible in about 4% of cases that an erroneous write operation will be produced. This considerably reduces the risks of error.

Furthermore, the writing is done only when the totality of the bits are received. It is no longer possible to have write errors due to the writing in two stages of the 16-bit words.

Those skilled in the art could modify certain elements of the preferred embodiment at leisure without changing the spirit of the invention. Thus, the choice of the different logic levels and consequently of the logic gates is quite arbitrary. Furthermore, certain signals offer certain liberties with respect to the shape shown in the timing diagrams. These signals are for example A0, INCR, MEM, FINC, SM and RM.

Simple variants corresponding to the combination of the invention with the prior art can also be envisaged. For example, it is possible, by means of an additional instruction bit, for example OPC3, to choose whether the word to be written (or read) is encoded on 8 or 16 bits. In this case, the fourth input terminal will be connected to a register for the storage of the mode of operation which could very well form part of the control circuit 10. It is also possible to have systems with fixed word sizes or with word sizes that are variable in multiples of a defined size that could be other than 8 bits.

The starting bit SB is not necessary to the invention but reduce the risks, if any, of unnecessary starting sequences which may slow the memory down. The choice of the state of the bit is purely arbitrary and may even, in certain cases, be replaced by a succession of bits.

It is possible for example to take account of the signal CS to enable the clock signal in order to carry an error occurring on the selection signal over into the clock signal. In this case, it is not necessary to detect the non-coincidence between the trailing edge of the selection signal CS and the clock signal CP.

Having thus described at least one illustrative embodiment of the invention, various alterations, modifications and improvements will readily occur to those skilled in the art. Such alterations, modifications and improvements are intended to be within the spirit and scope of the invention. Accordingly, the foregoing description is by way of example only and is not intended as limiting. The invention is limited only as defined in the following claims and the equivalent thereto.

What is claimed is:

1. A method of writing data in a serial access memory that includes at least one matrix of memory cells, a clock signal input terminal receiving a clock signal, a data input terminal receiving a defined number of data bits, including a last data bit, in series and a selection terminal receiving a selection signal, the method comprising steps of:

initializing a writing cycle when the selection signal changes from a first state to a second state;

writing data in the at least one matrix of memory cells only if the selection signal goes from the second state to the first state during a period of the clock signal just after the last data bit has been received.

2. The method of claim 1, wherein the step of initializing occurs only if:

a starting bit, positioned in a predefined state, is received at the data input terminal at the beginning of a clock period when the selection signal changes from the first state to the second state; and the starting bit is followed by a succession of bits each spaced out by a clock period, the succession of bits corresponding to instructions, addresses and data elements.

3. The method of claim 2, wherein the defined number of data bits may have a first value or a second value depending on a state of a mode bit of the memory, the second value corresponding to twice the first value.

4. The method of claim 3, wherein the memory further includes a counter that receives the clock signal and wherein the method further comprises a step of counting clock bits to determine which data bit is the last data bit.

5. The method of claim 4 wherein, if the defined number has the first value, then the counter carries out a full counter cycle to determine the last data bit and wherein, if the defined number has the second value, then the counter carries out two full counter cycles to determine the last data bit.

6. The method of claim 1, wherein the defined number of bits may have one of a first value and a second value depending on a state of a mode bit of the memory, the second value corresponding to twice the first value.

7. The method of claim 1, wherein the memory further includes a counter that receives the clock signal and wherein the method further comprises a step of counting clock bits to determine which data bit is the last data bit.

8. The method of claim 7 wherein, if the defined number has the first value, then the counter carries out a full counter cycle to determine the last data bit and wherein, if the defined number has the second value, then the counter carries out two full counter cycles to determine the last data bit.

9. A serial access memory comprising:
at least one matrix of memory cells;
a clock signal input terminal that receives a clock signal;
a data input terminal that receives a defined number of data bits, including a last bit, in series;
a selection terminal that receives a selection signal;
means for detecting changes in state of the selection signal; and
securing means for authorizing writing data in the matrix of memory cells only if the selection signal changes state during a period of the clock signal just after the last data bit has been received.

10. The memory of claim 9, wherein the matrix of memory cells is organized in words of bits of a defined size, and wherein the securing means includes means for indicating that the data input terminal will receive one of words of a first defined size and words of a second defined size, the second defined size being twice the first defined size.

11. The memory of claim 10, wherein the securing means further includes:
a counter that receives the clock signal and an enabling signal, and provides an end-of-count signal at an end of a counter cycle;
window-setting means for positioning an enabling signal in an enabling state during a temporal window which lasts during a clock period and starts immediately after receipt of the end-of-count signal from a first counting operation if the indication means indicate that the data terminal will receive words of the first defined size and immediately after having received two successive end-of-count signals if the indication means indicate that the data terminal will receive words of the second defined size;
a logic gate having a first input, a second input and an output, the first input being connected to the selection terminal and the second input being connected to the window-setting means to receive the enabling signal, the output providing a write signal in an authorization state if the enabling signal is in an enabling state while the selection signal changes state.

12. An interface circuit for a memory, comprising:
a first output that provides an enable signal to enable the memory to write data to the memory;
a first input that receives a clock signal having a clock period;
a second input that receives a data signal having a number of bits including a last bit;
a third input that receives a selection signal; and
a control circuit, coupled to the first, second and third inputs and to the first output, and constructed and arranged to generate the enable signal if the selection signal changes state during a clock period after the last bit has been received by the control circuit.

13. The interface circuit of claim 12, further comprising:
a second output that provides an address in the memory to which data is to be written; and
an address register, coupled to the first input, the second input and the second output, and constructed and arranged to provide the address to the second output.

14. The interface circuit of claim 13, further comprising:
a third output that provides data to be written to the memory; and
a shift register, coupled to the second input and the third output, and constructed and arranged to receive and store the data to be written to the memory and to provide the data to the third output.

15. The interface circuit of claim 14, further comprising:
a fourth input coupled to the control circuit and the address register that receives a word length signal that indicates that a word length of the data to be written to memory is either a first length or a second length, wherein the second length is approximately twice the first length; and
wherein the control circuit includes a logic circuit responsive to the word length signal that generates the enable signal after one cycle of the clock signal if the data has the first length and after two cycles of the clock signal if the data has the second length.

16. The interface circuit of claim 15, in combination with the memory.

17. The interface circuit of claim 12, further comprising:
a fourth input coupled to the control circuit and the address register that receives a word length signal that indicates that a word length of the data to be written to memory is either a first length or a second length, wherein the second length is approximately twice the first length; and
wherein the control circuit includes a logic circuit responsive to the word length signal that generates the enable signal after one cycle of the clock signal if the data has the first length and after two cycles of the clock signal if the data has the second length.

18. A method of writing data to a memory, the memory having an enable input for receiving an enable signal to enable the writing of data to the memory, and a data input for receiving a number of bits of data, including a last data bit, to be written to the memory, the method comprising steps of:
receiving a selection signal;
receiving a clock signal having a clock period;
receiving the bits of data; and
generating the enable signal if the selection signal changes from a first state to a second state and if after the last data bit has been received, the selection signal changes from the second state to the first state.

19. The method of claim 18, wherein the enable signal is generated only if the change from the second state to the first state of the selection signal occurs during a first clock period after the receipt of the last data bit.

20. The method of claim 19, further comprising a step of receiving a word length signal that indicates that a word length of the bits of data is either a first length or a second length, wherein the second length is approximately twice the first length; and wherein the step of generating includes generating the enable signal after one cycle of a clock signal if the data has the first length and after two cycles of the clock signal if the data has the second length.

21. The method of claim 20, further comprising a step of writing the data to the memory when the enable signal is generated.

22. The method of claim 18, further comprising a step of receiving a word length signal that indicates that a word length of the bits of data is either a first length or a second length, wherein the second length is approximately twice the first length; and wherein the step of generating includes generating the enable signal after one cycle of a clock signal if the data has the first length and after two cycles of the clock signal if the data has the second length.

23. An interface circuit for a memory, the memory having an enable input for receiving an enable signal to enable the writing of data to the memory, and a data input for receiving a number of bits of data, including a last data bit, to be written to the memory, the circuit comprising:

a first input that receives a selection signal;

a second input that receives a clock signal having a clock period;

a third input that receives the bits of data; and means for generating the enable signal if the selection signal changes from a first state to a second state and if after the last data bit has been received, the selection signal changes from the second state to the first state.

24. The interface circuit of claim 23, wherein the enable signal is generated only if the change from the second state to the first state of the selection signal occurs during a first clock period after the receipt of the last data bit.

25. The interface circuit of claim 24, further comprising means for receiving a word length signal that indicates that a word length of the data is either a first length or a second length, wherein the second length is approximately twice the first length; and wherein the means for generating includes means for generating the enable signal after one cycle of a clock signal if the data has the first length and after two cycles of the clock signal if the data has the second length.

26. The method of claim 22, further comprising means for writing the data to the memory when the enable signal is generated.

27. The method of claim 22, further comprising means for receiving a word length signal that indicates that a word length of the data is either a first length or a second length, wherein the second length is approximately twice the first length; and wherein the means for generating includes means for generating the enable signal after one cycle of a clock signal if the data has the first length and after two cycles of the clock signal if the data has the second length.

* * * * *